United States Patent
Cao

(10) Patent No.: US 11,222,570 B2
(45) Date of Patent: Jan. 11, 2022

(54) DISPLAY PANEL AND DRIVING METHOD

(71) Applicants: HKC Corporation Limited, Shenzhen (CN); Chongqing HKC Optoelectronics Technology Co., Ltd., Chongqing (CN)

(72) Inventor: Junhong Cao, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 17/043,421

(22) PCT Filed: Nov. 1, 2018

(86) PCT No.: PCT/CN2018/113426
§ 371 (c)(1),
(2) Date: Sep. 29, 2020

(87) PCT Pub. No.: WO2020/047983
PCT Pub. Date: Mar. 12, 2020

(65) Prior Publication Data
US 2021/0020091 A1      Jan. 21, 2021

(30) Foreign Application Priority Data

Sep. 7, 2018  (CN) .......................... 201811044655.3

(51) Int. Cl.
*G09G 3/20*   (2006.01)
(52) U.S. Cl.
CPC ....... *G09G 3/20* (2013.01); *G09G 2310/0267* (2013.01)
(58) Field of Classification Search
CPC .......................... G09G 3/20; G09G 2310/0267
See application file for complete search history.

(56) References Cited

U.S. PATENT DOCUMENTS

| 2011/0310074 A1 | 12/2011 | Ochiai et al. |
| 2012/0086627 A1 | 4/2012 | Chen et al. |

(Continued)

FOREIGN PATENT DOCUMENTS

| CN | 1401114 A | 3/2003 |
| CN | 101477836 A | 7/2009 |

(Continued)

OTHER PUBLICATIONS

International Search Report dated Jun. 14, 2019, issued in corresponding International Application No. PCT/CN2018/113426, filed Nov. 1, 2018, 2 pages.

(Continued)

*Primary Examiner* — Sejoon Ahn
(74) *Attorney, Agent, or Firm* — Christensen O'Connor Johnson Kindness PLLC

(57) ABSTRACT

Disclosed are a display panel and a driving method. The display panel comprises: a cascade array substrate gate electrode driving unit, each cascade array substrate gate electrode driving unit being provided on at least one side of the display panel, coupled with multiple scan lines (G1-GN and G1'-GN'), and outputting driving signals for the scan lines (G1-GN and G1'-GN') in a preset order; front virtual array substrate gate electrode driving units, provided at one end of the cascade array substrate gate electrode driving units and provided to generate a trigger signal and to output same to the corresponding cascade array substrate gate electrode driving units; and a rear virtual array substrate gate electrode driving unit, provided at the other end of the cascade array substrate gate electrode driving units and provided to generate a reset signal and to output same to the corresponding cascade array substrate gate electrode driving units.

18 Claims, 10 Drawing Sheets

(56) References Cited

U.S. PATENT DOCUMENTS

| | | | |
|---|---|---|---|
| 2019/0096306 A1* | 3/2019 | Kong | G09G 3/20 |
| 2019/0141357 A1* | 5/2019 | Endo | G09G 5/377 |
| 2019/0212610 A1* | 7/2019 | Kim | G02F 1/133514 |
| 2019/0213923 A1* | 7/2019 | Meng | G09G 3/20 |

FOREIGN PATENT DOCUMENTS

| | | |
|---|---|---|
| CN | 101727859 A | 6/2010 |
| CN | 102789757 A | 11/2012 |
| CN | 104318890 A | 1/2015 |
| CN | 104503179 A | 4/2015 |
| CN | 105719593 A | 6/2016 |
| CN | 106502014 A | 3/2017 |
| CN | 107104113 A | 8/2017 |
| CN | 107808651 A | 3/2018 |
| CN | 107993626 A | 5/2018 |
| KR | 20080040448 A | 5/2008 |

OTHER PUBLICATIONS

Notice of Reason for Rejection dated Oct. 31, 2019, issued in Chinese Application No. 201811044655.3, filed Sep. 7, 2018, 9 pages.
Notice of Reason for Rejection dated Jul. 3, 2020, issued in Chinese Application No. 201811044655.3, filed Sep. 7, 2018, 8 pages.
Office action dated Dec. 15, 2020, issued in correspondence to Chinese Application No. 201811044655.3, filed Sep. 7, 2019, 11 pages.

* cited by examiner

DISPLAY PANEL AND DRIVING METHOD

CROSS REFERENCE TO RELATED APPLICATIONS

This application claims priority to Chinese Patent Application No. 201811044655.3, filed on Sep. 7, 2018 and entitled "DISPLAY PANEL, DISPLAY DEVICE, AND DRIVING METHOD", which is incorporated herein by reference in its entirety.

TECHNICAL FIELD

The application relates to the field of display technologies, and more particularly, to a display panel and a driving method.

BACKGROUND

The Gate Driver on Array (GOA) technology is a technology in which a gate driver IC is directly manufactured on an array substrate to replace an external driving circuit. The GOA technology can simplify the process for preparing a display panel, skip the IC bonding process in the horizontal scanning line direction, and reduce the production costs. Meanwhile, it can improve the integration of the display panel and produce a thinner display panel.

With the development of the display technology, the resolution of the display panel gets increasingly higher, and the higher the resolution becomes, the more gate lines in the display area would be. However, in conventional GOA circuits, each GOA unit only provides a signal input for the gate line of pixels of one line correspondingly. Therefore, the required number of GOA unit circuits gets increasingly larger as well, which in turn results in a great deal of difficulties and costs in manufacturing of the integration of GOA circuits, unfavorable for realizing frame narrowing. Moreover, the larger the number of gate lines is, the shorter the scanning time of each gate line would be. As a result, the charging efficiency of the display panel is depressed, failing to meet the demand for high-resolution screen display.

SUMMARY

In view of this, the present application discloses a display panel and a driving method having high charging efficiency.

A display panel, including:

at least one cascaded GOA unit, the one or more cascaded GOA units being arranged on at least one side of the display panel and coupled to a plurality of scanning lines and outputting a driving signal for each of the scanning lines in a preset sequence;

a front dummy GOA unit arranged on one end of each of the cascaded GOA units, and configured to generate a trigger signal and output the trigger signal to the corresponding cascaded GOA unit; and a rear dummy GOA unit arranged on the other end of each of the cascaded GOA units, and configured to generate a reset signal and output the reset signal to the corresponding cascaded GOA unit.

A display panel, including:

at least one cascaded GOA unit, the one or more cascaded GOA units being arranged on two opposite sides of the display panel, at least two of the cascaded GOA units being arranged on each side, and each of the cascaded GOA units being coupled to a plurality of scanning lines and outputting a driving signal for each of the scanning lines line by line;

a front dummy GOA unit arranged on one end of each of the cascaded GOA units, and configured to generate a trigger signal and output the trigger signal to the corresponding cascaded GOA unit; and a rear dummy GOA unit arranged on the other end of each of the cascaded GOA units, and configured to generate a reset signal and output the reset signal to the corresponding cascaded GOA unit.

the source driving unit is connected to the display panel through a chip on film (COF).

A driving method for a display panel, the display panel including at least one cascaded GOA unit, the one or more cascaded GOA units being arranged on at least one side of the display panel and coupled to a plurality of scanning lines and outputting a driving signal for each of the scanning lines in a preset sequence;

a front dummy GOA unit arranged on one end of each of the cascaded GOA units, and configured to generate a trigger signal and output the trigger signal to the corresponding cascaded GOA unit; and a rear dummy GOA unit arranged on the other end of each of the cascaded GOA units, and configured to generate a reset signal and output the reset signal to the corresponding cascaded GOA unit, the cascaded GOA units sequentially including a first stage of GOA units to a GOA unit of the last stages, and each stage of the GOA units being coupled to one of the scanning lines; and the method including:

receiving a scan start signal to generate a trigger signal;

generating, according to the trigger signal, a first stage scanning line driving signal for each of the cascaded GOA units;

sequentially outputting the first stage scanning line driving signal to a last stage scanning line driving signal for each of the cascaded GOA units;

generating a reset signal according to the last stage scanning line driving signal for each of the cascaded GOA units; and controlling, using the reset signal, the last stage of scanning line driving signal for each of the cascaded GOA units.

The display panel described above is provided with a plurality of cascaded GOA units, and each of the cascaded GOA units is coupled to a plurality of scanning lines, and the scanning line driving signals of the corresponding cascaded GOA units are controlled by using the front dummy GOA unit and the rear dummy GOA unit, thereby realizing the output of the scanning line driving signals of each scanning line on the display panel. Since the display panel is provided with a plurality of cascaded GOA units, the number of scanning lines coupled to each of the cascaded GOA units is thus reduced, and thereby the input time of scanning line driving signals for each scanning line is increased and the charging efficiency of the display panel is improved.

BRIEF DESCRIPTION OF THE DRAWINGS

To describe the technical solutions in the embodiments of this application or in the prior art more clearly, the following briefly introduces the accompanying drawings required for describing the embodiments or the prior art. Apparently, the accompanying drawings in the following description show merely the embodiments of this application, and a person of ordinary skill in the art may still derive other drawings from these accompanying drawings without creative efforts.

DETAILED DESCRIPTION OF THE EMBODIMENTS

The following clearly and completely describes the technical solutions in the embodiments of this application with reference to the accompanying drawings in the embodiments of this application. Apparently, the described embodiments are some embodiments of this application rather than all of the embodiments. All other embodiments obtained by a person of ordinary skill in the art based on the embodiments of this application without creative efforts shall fall within the protection scope of this application.

The present application discloses a display panel having high charging efficiency and a driving method.

Figure 1:
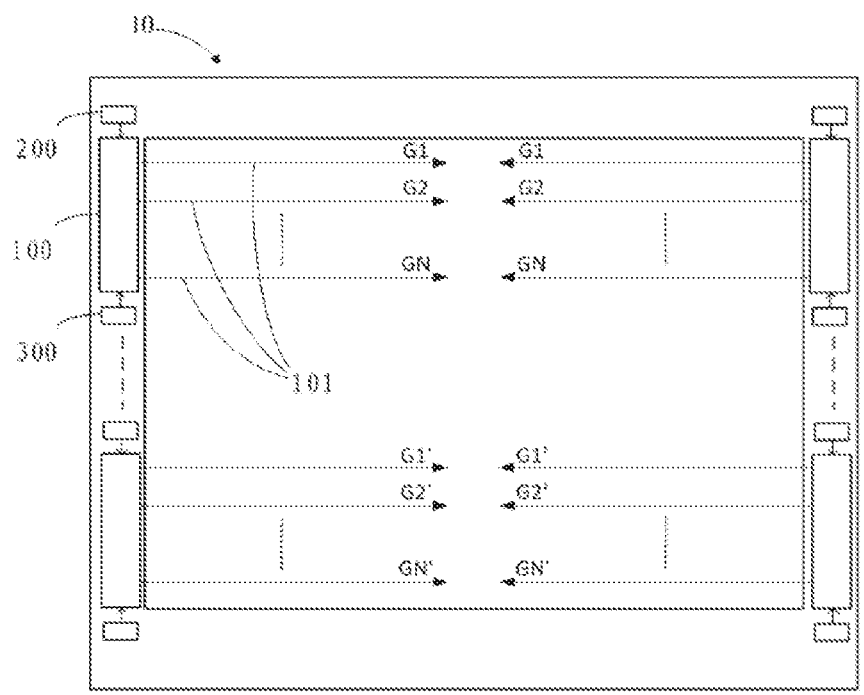
FIG. 1 is a schematic structural diagram of a display panel according to an embodiment.

FIG. 1 is a schematic structural diagram of a display panel according to an embodiment. The display panel 10 includes:

at least one cascaded GOA unit 100, each of cascaded GOA units 100 being arranged on at least one side of the display panel 10 and is coupled to a plurality of scanning lines 101 (G1, G2, . . . , GN). A driving signal for each of the scanning lines 101 (G1, G2, . . . , and GN) is output in a preset sequence. The preset order is to output the driving signals for the scanning lines 101 line by line or to output the driving signals for the scanning lines 101 every other two lines.

The front dummy GOA unit 200 is arranged on one end of each of the cascaded GOA units 100. The front dummy GOA unit 200 is configured to generate a trigger signal and output it to the corresponding cascaded GOA units 100, so as to control the first stage scanning line driving signal for the corresponding cascaded GOA units 100. As can be understood, the first stage scanning line driving signal is output to the first scanning line 101 (G1) coupled to the cascaded GOA units 100.

The rear dummy GOA unit 300 is arranged on the other end of each of the cascaded GOA units 100. The rear dummy GOA unit 300 is configured to generate a reset signal and output it to the corresponding cascaded GOA units 100, so as to control the last stage scanning line driving signal for the corresponding cascaded GOA units 100. As can be understood, the last stage scanning line driving signal is output to the last scanning line 101 (GN) coupled to the cascaded GOA units 100.

In this embodiment, since the display panel 10 is provided with a plurality of the cascaded GOA units 100, the number of the scanning lines 101 coupled to each of the cascaded GOA units 100 is thus reduced, and thereby the scanning time for each of the scanning lines 101 is increased and the charging efficiency of the display panel 10 is improved.

Figure 2:
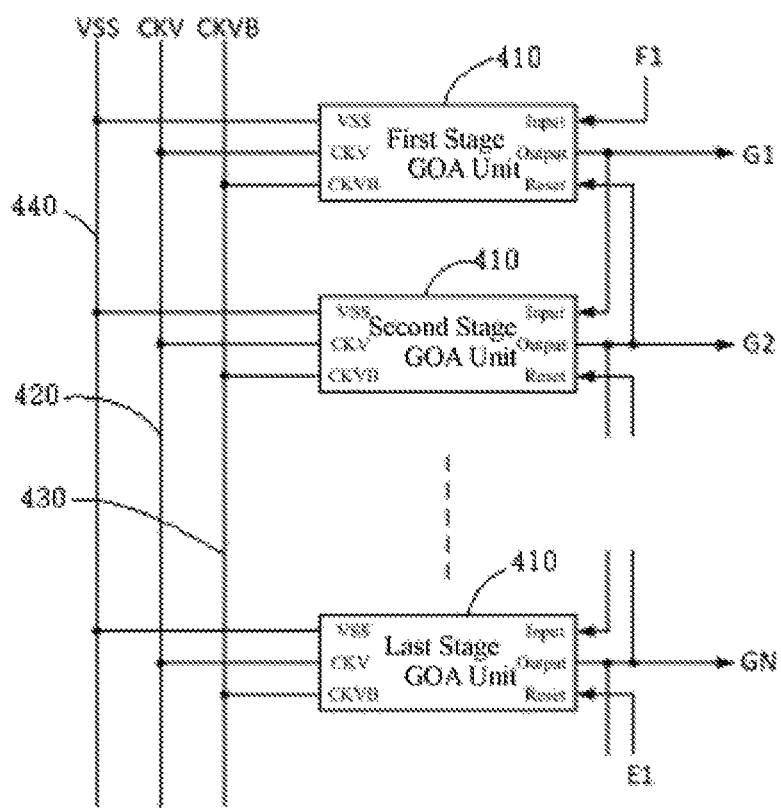
FIG. 2 is a schematic diagram of cascaded GOA units according to an embodiment.

Specifically, as shown in FIG. 2, the cascaded GOA units 100 include GOA units 410 of multistage, which sequentially is the GOA unit 410 of the first stage, the GOA unit 410 of the second stage, . . . , and the GOA unit 410 of the last stage. Specifically, the output ends of the GOA unit 410 of the first stage, the GOA unit 410 of the second stage, . . . , and the GOA unit 410 of the last stage are each coupled to one of the scanning lines 101, which sequentially are G1, G2, . . . , and GN.

In this embodiment, a first clock signal input (CKV) end of the GOA unit 410 of each stage is connected to a first clock signal input (CKV) line 420. A second clock signal input (CKVB) end of the GOA unit 410 of each stage is connected to a second clock signal input (CKVB) line 430. A supply voltage signal input (VSS) end of the GOA unit 410 of each stage is connected to a supply voltage signal input (VSS) line 440. In the GOA unit 410 of each stage, an output end of the GOA unit 410 of the previous stage is connected to an input end of the GOA unit 410 of the next stage. The reset end of the previous stage of the GOA unit 410 is connected to the output end of the GOA unit 410 of the next stage. The input end of the GOA unit 410 of the first stage receives a trigger signal F1 (where the trigger signal F1 is generated by the front dummy GOA unit 200). The reset end of the GOA unit 410 of the last stage receives a reset signal E1 (the reset signal E1 is generated by the rear dummy GOA unit 300).

Figure 3:
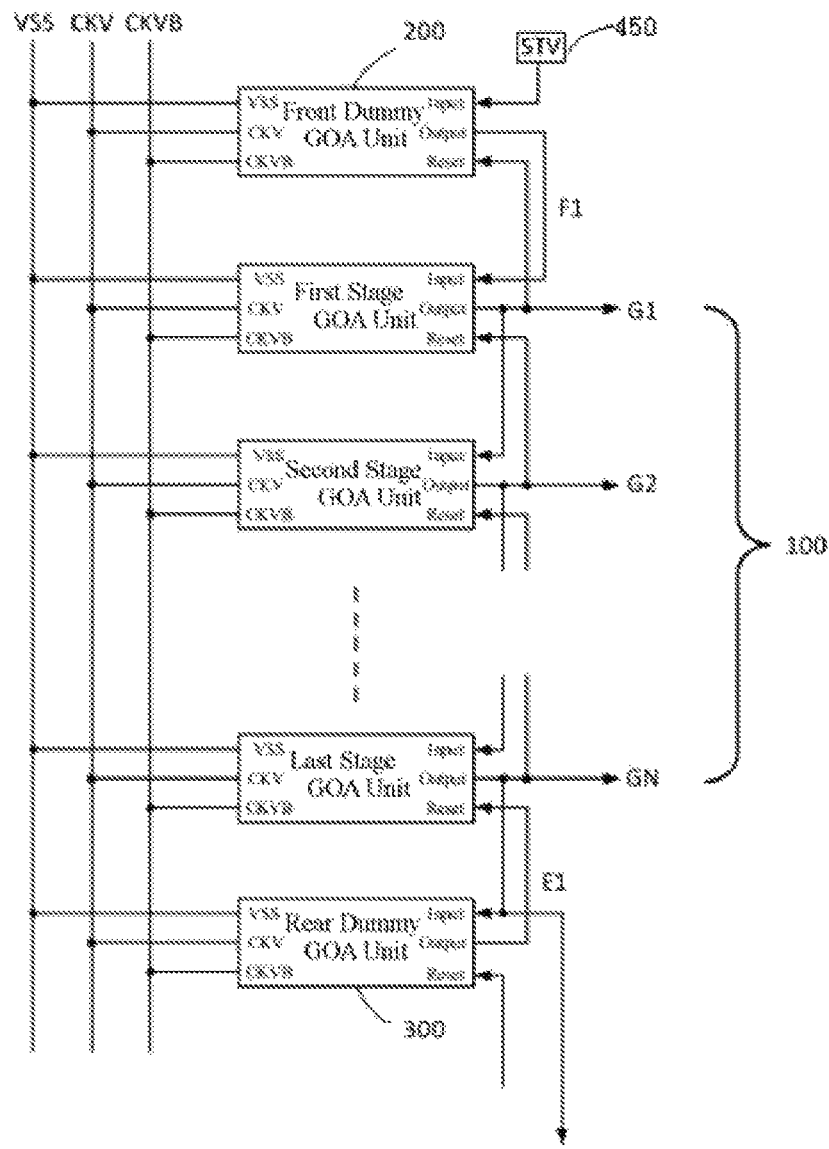
FIG. 3 is a schematic diagram of cascaded GOA units according to another embodiment.

Further, as shown in FIG. 3, the CKV end of the front dummy GOA unit 200 is connected to the first clock signal input (CKV) line 420. The CKVB end of the front dummy GOA unit 200 is connected to the second clock signal input (CKVB) line 430. The VSS end of the front dummy GOA unit 200 is connected to the supply voltage signal input line 440 (VSS). The input end of the dummy GOA unit 200 receives an start signal 450 (STV) of the system. The output end of the front dummy GOA unit 200 is connected to the input end of the GOA unit 410 of the first stage in the cascaded GOA units 100 to input the generated trigger signal F1 to the GOA unit 410 of the first stage. The reset end of the front dummy GOA unit 200 is connected to the output end of the GOA unit 410 of the first stage.

The CKV end of the rear dummy GOA unit 300 is connected to the first clock signal input (CKV) line 420. The CKVB end of the rear dummy GOA unit 300 is connected to the second clock signal input (CKVB) line 430. The VSS end of the rear dummy GOA unit 300 is connected to the supply voltage signal input line 450 (VSS). The input end of the rear dummy GOA unit 300 is connected to the output end of the GOA unit 410 of the last stage in the cascaded GOA units 100. The output end of the rear dummy GOA unit 300 is connected to the reset end of the GOA unit 410 of the last stage to input the generated reset signal E1 to the GOA unit 410 of the last stage. The reset end of the rear dummy GOA unit 300 is electrically connected to a system reset circuit 460.

In this embodiment, the GOA unit 410 of each stage of the cascaded GOA units 100 has two stages of loading, to be specific, the previous stage and the next stage. For details, referring to FIG. 3, the front dummy GOA unit 200 may be considered as a previous loading of the GOA unit 410 of the first stage. The rear dummy GOA unit 300 may be considered as a next loading of the GOA unit 410 of the last stage. Therefore, the GOA unit 410 of each stage (the GOA unit 410 of the first stage to the GOA unit 410 of the last stage) has two stages of loading, so that the impedance of the GOA unit 410 of each stage matches.

Figure 4:
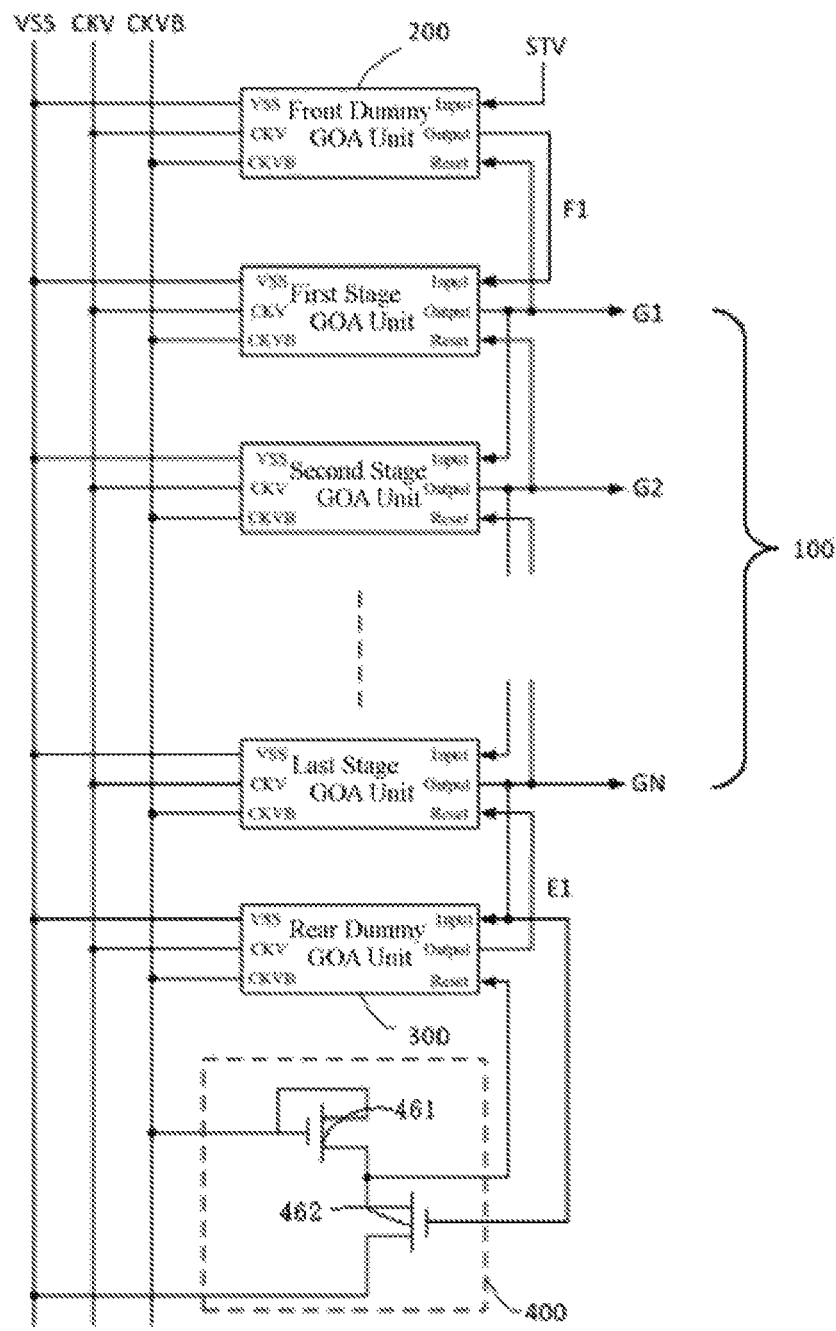
FIG. 4 is a schematic diagram of cascaded GOA units according to another embodiment.

Specifically, as shown in FIG. 4, the system reset circuit 400 includes a first transistor 461 and a second transistor 462. The gate of the first transistor 461 is electrically connected to the second clock signal input line 430. The drain of the second transistor 462 is electrically connected to the source of the first transistor 461 and the reset end of the rear dummy GOA unit 300. The source of the second transistor 462 is electrically connected to the supply voltage signal input line 440. The gate of the second transistor 462 is electrically connected to the input end of the rear dummy GOA unit 300.

The system reset circuit 400 is configured to provide a reset signal to the rear dummy GOA unit 300. When the input signal of the input end of the rear dummy GOA unit 300 is at a low level, the second transistor 462 is turned off. The first transistor 461 turns on with the high voltage period of the second clock signal line (CKVB). The input signal for the reset end of the rear dummy GOA unit 300 is at a high level, and the rear dummy GOA unit 300 is reset. When the input signal of the input end of the rear dummy GOA unit 300 is at a high level, the second transistor 462 is turned on. The input signal for the reset end of the rear dummy GOA unit 300 is at a low level, and the rear dummy GOA unit 300 stops resetting.

Optionally, the first transistor 461 and the second transistor 462 are N-type field effect transistors.

Figure 5:
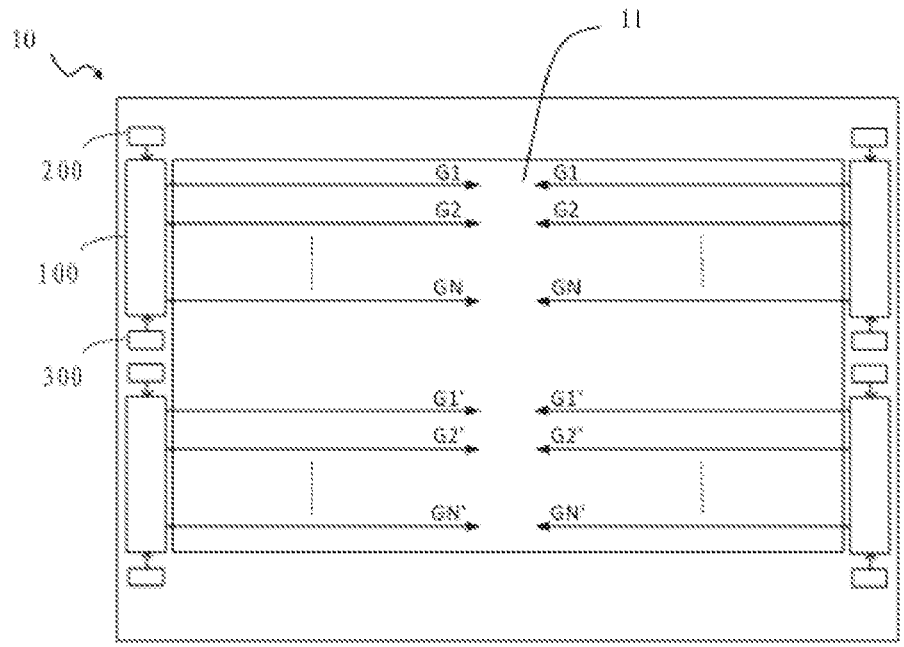
FIG. 5 is a schematic structural diagram of a display panel according to another embodiment.

Specifically, as shown in FIG. 5, all of the cascaded GOA units 100 are arranged on two opposite sides of the display panel 10, and at least two of the cascaded GOA units 100 are arranged on each side. In the embodiment of FIG. 5, the arrangement of at least two of the cascaded GOA units 100 on each side is used as an example.

According to one aspect, when the resolution of the display panel 10 is increasingly higher, there are more TFT (Thin Film Transistor) switches in the display area 11. Further, each of the cascaded GOA units 100 needs to provide a larger driving voltage of the scanning line 101 to turn on the TFT switch in the display area 11. Therefore, for this embodiment, the cascaded GOA units 100 are arranged on two opposite sides of the display panel 10, respectively. The number of TFT switches to be driven by each of the cascaded GOA units is halved. Thus, the driving voltage of the scanning line 101 required to be output by each of the cascaded GOA units is reduced and the manufacturing difficulty and costs of the cascaded GOA units can be reduced.

According to another aspect, when the resolution of the display panel 10 is increasingly higher, there are more scanning lines required for the display area 11. If only one of the cascaded GOA units is arranged in the scanning line driving area (the area in which the cascaded GOA units are arranged in FIG. 5), the input time of the driving voltage for each of the scanning lines 101 is shorter. Therefore, the charging time of each pixel unit (not shown) of the display area 11 is shorter.

For example, for an 8K4K (resolution: 7680 RGB*4320) Half Source Driver (HSD) display panel, if just one of the cascaded GOA units 100 is arranged in the scanning line driving area, the input time of the driving voltage for each of the scanning lines 101 is 1/60/8640≈1.929 μs. If the scanning line driving area is provided with two of the cascaded GOA units 100, the input time of the driving voltage for each of the scanning lines 101 is 1/60/4320≈3.858 μs. It can thus be learned that increasing the number of cascaded GOA units 100 can not only reduce the manufacturing difficulty of each of the cascaded GOA units 100, but can also increase the input time of the driving voltage for each of the scanning lines 101 (that is, increase the charging time of each pixel unit in the display area 11). Thus the display panel 10 has a good gradation display. The screen display effect is thereby improved.

In one embodiment, the adjacent ends of the cascaded GOA units 100 are each provided with one rear dummy GOA unit 300.

Figure 6:
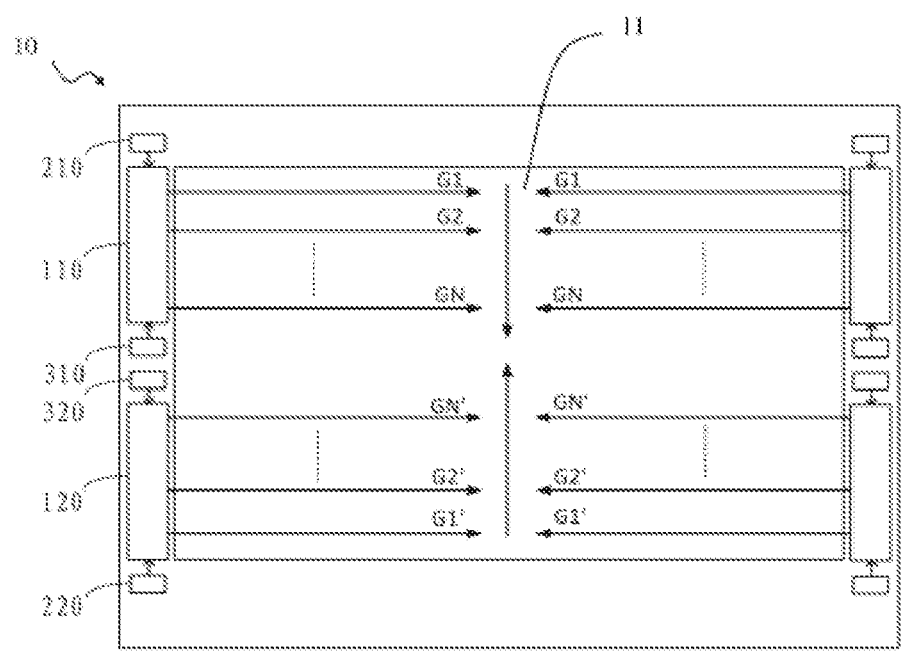
FIG. 6 is a schematic structural diagram of a display panel according to another embodiment.

In this embodiment, referring to FIG. 6, the arrangement of two of the cascaded GOA units 100 on each side of the display panel 10 is used as an example. For convenience of description, two of the cascaded GOA units 100 on one side of the display area 11 are named as a first cascaded GOA unit 110 and a second cascaded GOA unit 120, respectively. Two ends of the first cascaded GOA unit 110 are respectively provided with a first front dummy GOA unit 210 and a first rear dummy GOA unit 310. Two ends of the second cascaded GOA unit 120 are respectively provided with a second front dummy GOA unit 220 and a second rear dummy GOA unit 320. Specifically, the first rear dummy GOA unit 310 is arranged adjacent to the second rear dummy GOA unit 320. After the first front dummy GOA unit 210 receives the scan start signal 450 (STV), the first cascaded GOA unit 110 outputs the scanning line 101 driving signal line by line in the direction of G1 to GN. After the second front dummy GOA unit 220 receives the scan start signal 450 (STV), the second cascaded GOA unit 120 outputs the scanning line 101 driving signal line by line in the direction of G1' to GN'. Since the driving mode of the cascaded GOA units, the front dummy GOA unit and the rear dummy GOA unit on both sides of the display area 11 are identical, duplicate discussion will be omitted herein.

Figure 7:
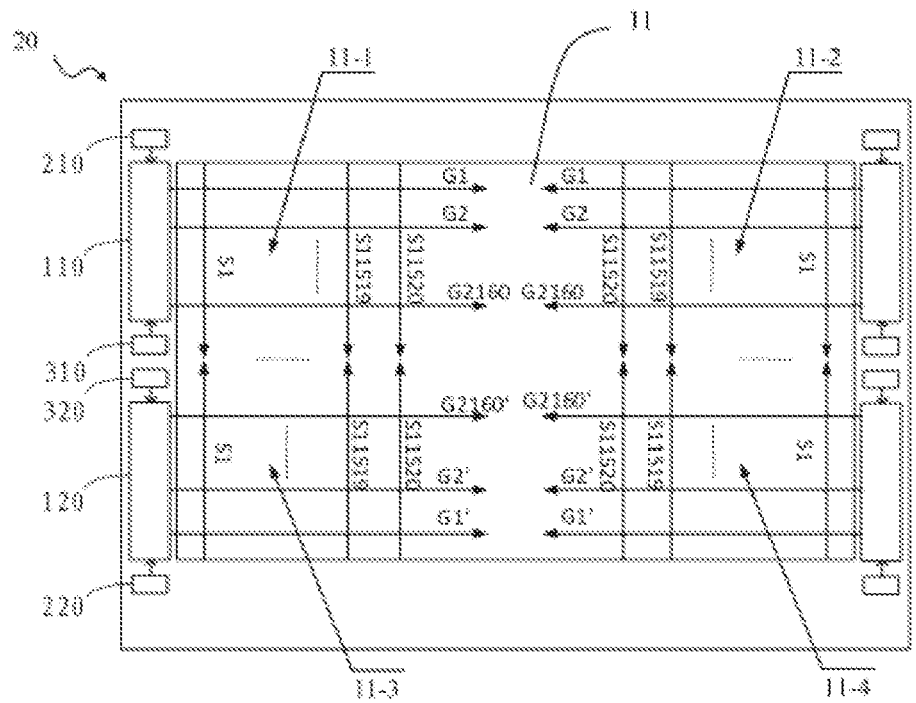
FIG. 7 is a schematic structural diagram of an 8K4K display panel according to an embodiment.

For example, for the 8k4k 1G1D (normal driving) display panel 20, referring to FIG. 7, the resolution of the 8k4k 1G1d display panel 20 is 7680 RGB*4320. That is to say, 7680*3=23040 data lines and 4320 scanning lines are provided in the display area 11. When two of the cascaded GOA units 100 are respectively arranged on both sides of the display area 11 and the corresponding two rear dummy GOA units are adjacent (that is, the first rear dummy GOA unit 310 is adjacent to the second rear dummy GOA unit 320), the driving mode of the 1G1D display panel 20 is that the scanning line voltage driving signals of the 1G1D display panel 20 are input from the upper and lower edges of the display area 11 and scan line by line toward the middle of the display area.

It can be understood that when the input time of the driving voltage for each scanning line in 1G1D display panel 20 is calculated, the display area 11 can be divided into four display areas: the first area 11-1, the second area 11-2, the third area 11-3, and the fourth area 11-4. The number of scanning lines in each area is 2160 (4320÷2=2160), the number of data lines is 11520 (23040÷2=11520), and the scanning line driving signal for each display area is input by one of the cascaded GOA units 100. Therefore, using the first area 11-1 as an example, in the scanning lines G1 to G2160, the input time of the driving voltage for each scanning line is 1/60/2160≈7.716 µs. If only one of the cascaded GOA units 100 is arranged on one side of the display area 11 (that is, the scanning line driving area), the input time of the driving voltage for each scanning line is 1/60/4320≈3.858 µs. It can thus be learned that when two of the cascaded GOA units 100 are arranged in the scanning line driving area, the input time of the driving voltage for each scanning line is twice as long as when one of the cascaded GOA units 100 is arranged. Therefore, in this embodiment, the pixel charging time of the display area 11 is increased by twice, thereby improving the screen display effect.

It can be understood that this embodiment is also applicable to 8K4K HSD display panel and 8K4K TRD (Triple Rate Driver) display panel, and their cascaded GOA units are arranged the same, duplicate discussion will be omitted herein.

In one of the embodiments, the adjacent ends of the cascaded GOA units 100 are each provided with one front dummy GOA unit 200.

Figure 8:
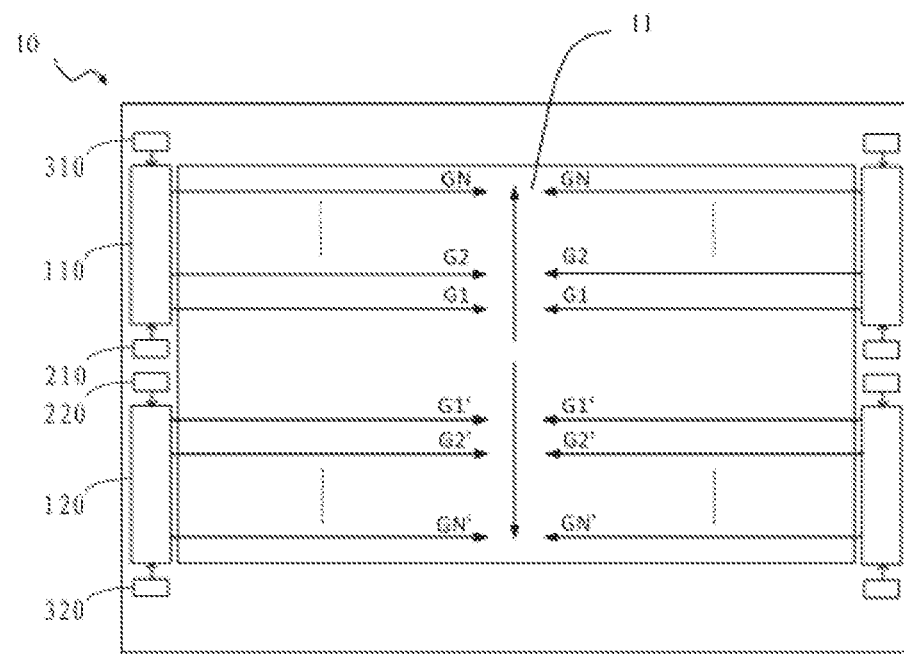
FIG. 8 is a schematic structural diagram of a display panel according to another embodiment.

In this embodiment, referring to FIG. 8, using the arrangement of two of the cascaded GOA units 100 on each side of the display panel 10 as an example, for convenience of description, two of the cascaded GOA units 100 on one side of the display area 11 are named as a first cascaded GOA unit 110 and a second cascaded GOA unit 120, respectively. Two ends of the first cascaded GOA unit 110 are respectively provided with a first front dummy GOA unit 210 and a first rear dummy GOA unit 310. Two ends of the second cascaded GOA unit 120 are respectively provided with a second front dummy GOA unit 220 and a second rear dummy GOA unit 320. Specifically, the first front dummy GOA unit 210 is arranged adjacent to the second front dummy GOA unit 220. After the first front dummy GOA unit 210 receives the scan start signal STV, the first cascaded GOA unit 110 outputs the scanning line driving signal line by line in the direction of G1 to GN. After the second front dummy GOA unit 220 receives the scan start signal STV, the second cascaded GOA unit 120 outputs the scanning line driving signal line by line in the direction of G1' to GN'. Since the driving mode of the cascaded GOA units, the front dummy GOA unit and the rear dummy GOA unit on both sides of the display area 11 are identical, duplicate discussion will be omitted herein.

Figure 9:
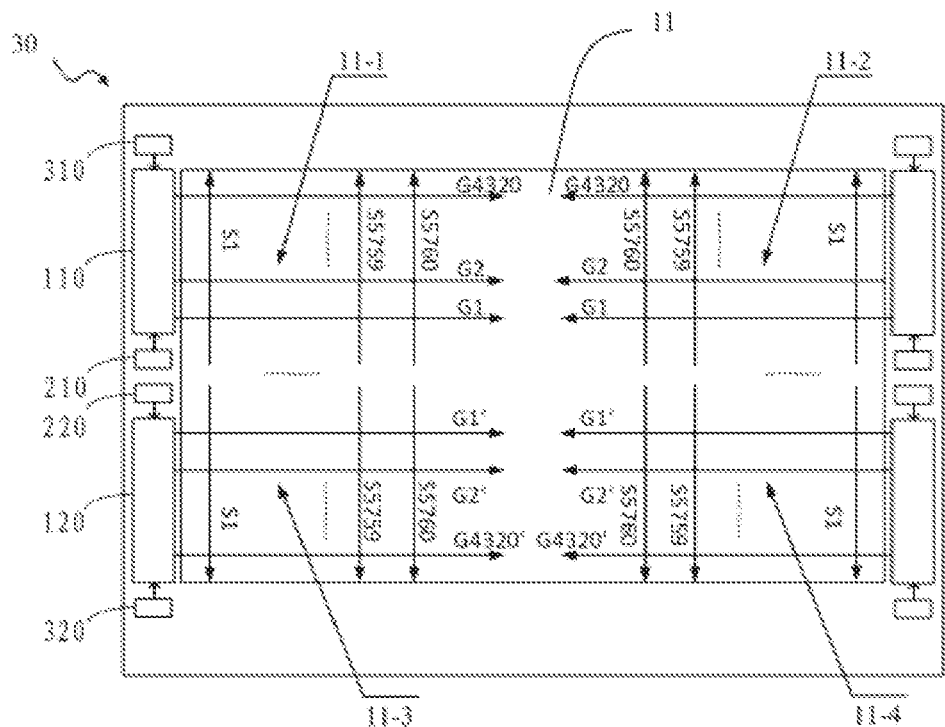
FIG. 9 is a schematic structural diagram of an 8K4K display panel according to another embodiment.

For example, for the 8K4K HSD display panel 30, referring to FIG. 9, the resolution of the 8K4K HSD display panel 30 is 7680 RGB/2*4320*2. That is to say, 7680=3/2=11520 data lines and 4320×2=8640 scanning lines are arranged in the display area 11. When two of the cascaded GOA units 100 are respectively arranged on both sides of the display area 11 and the corresponding two front dummy GOA units are adjacent (that is, the first front dummy GOA unit 210 is adjacent to the second front dummy GOA unit 220), the driving mode of the HSD display panel 30 is that the scanning line voltage driving signals of the HSD display panel 30 are input from the middle of the display area 11 and scan line by line toward the upper and lower edges of the display area.

It can be understood that when the input time of the driving voltage for each scanning line in HSD display panel 30 is calculated, the display area 11 can be divided into four display areas: the first area 11-1, the second area 11-2, the third area 11-3, and the fourth area 11-4. The number of scanning lines in each area is 4320 (8640÷2=4320), the number of data lines is 5760 (11520÷2=5760), and the scanning line driving signal for each display area is input by one of the cascaded GOA units 100. Therefore, using the first area 11-1 as an example, in the scanning lines G1 to G4320, the input time of the driving voltage for each scanning line is 1/60/4320≈3.858 µs. If only one of the cascaded GOA units 100 is arranged on one side of the display area 11 (that is, the scanning line driving area), the input time of the driving voltage for each scanning line is 1/60/8640≈1.929 µs. It can thus be learned that when two of the cascaded GOA units 100 are arranged in the scanning line driving area, the input time of the driving voltage for each scanning line is twice as long as when one of the cascaded GOA units 100 is arranged.

Therefore, in this embodiment, the pixel charging time of the display area 11 is increased by twice, thereby improving the screen display effect.

It can be understood that this embodiment is also applicable to 8K4K 1G1D display panel and 8K4K TRD (Triple Rate Driver) display panel, and their cascaded GOA units 100 are arranged the same, duplicate discussion will be omitted herein.

In one of the embodiments, one of the adjacent ends of each of the cascaded GOA units 100 is provided with one front dummy GOA unit 200, and the other one of the adjacent ends is provided with one rear dummy GOA unit 300.

Figure 10:
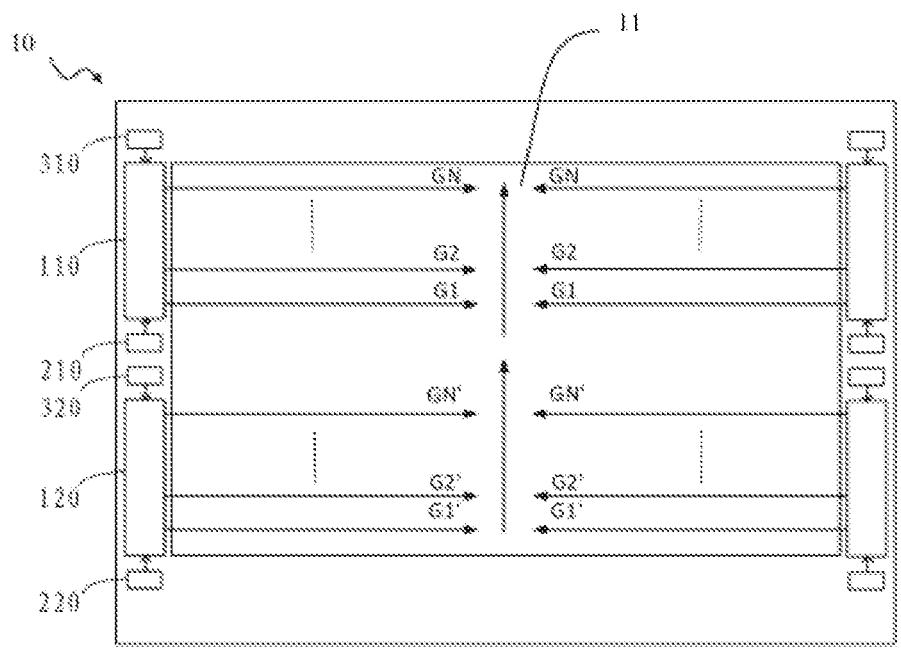
FIG. 10 is a schematic structural diagram of a display panel according to another embodiment.

In this embodiment, referring to FIG. 10, using the arrangement of two of the cascaded GOA units 100 on each side of the display panel 10 as an example, for convenience of description, two of the cascaded GOA units 100 on one side of the display area 11 are named as a first cascaded GOA unit 110 and a second cascaded GOA unit 120, respectively. Two ends of the first cascaded GOA unit 110 are respectively provided with a first front dummy GOA unit 210 and a first rear dummy GOA unit 310. Two ends of the second cascaded GOA unit 120 are respectively provided with a second front dummy GOA unit 220 and a second rear dummy GOA unit 320. Specifically, the first front dummy GOA unit 210 is arranged adjacent to the second rear dummy GOA unit 320. After the first front dummy GOA unit 210 receives the scan start signal STV, the first cascaded GOA unit 110 outputs the scanning line driving signal line by line in the direction of G1 to GN. After the second front dummy GOA unit 220 receives the scan start signal STV, the second cascaded GOA unit 120 outputs the scanning line driving signal line by line in the direction of G1' to GN'. That is to say, the driving mode of the scanning lines is that the scanning line voltage driving signals are input from the middle and lower edges of the display area 11 and scan line by line toward the upper and middle edges of the display area 11, respectively. Since the driving mode of the cascaded GOA units, the front dummy GOA unit and the rear dummy GOA unit on both sides of the display area 11 are identical, duplicate discussion will be omitted herein.

Figure 11:
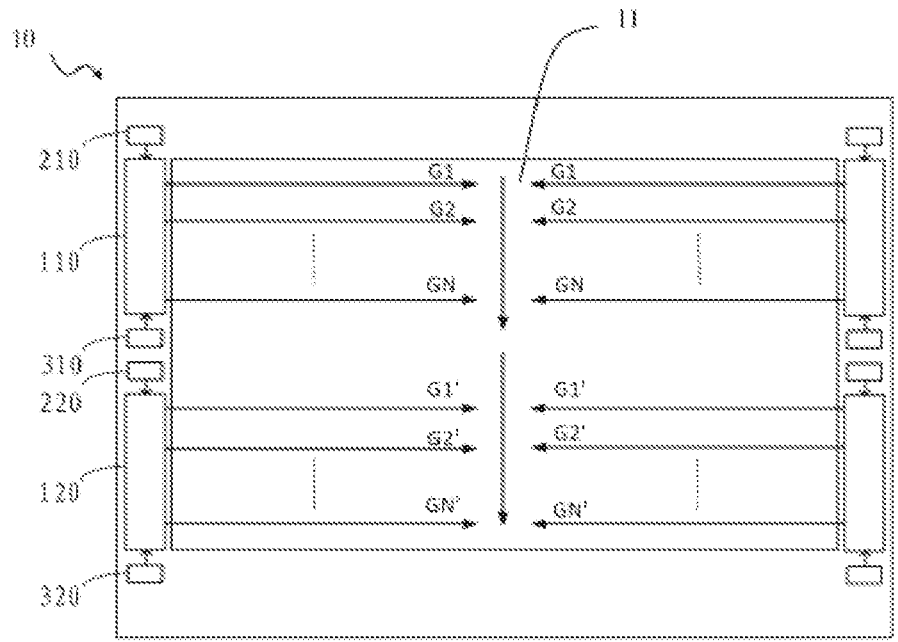
FIG. 11 is a schematic structural diagram of a display panel according to another embodiment.

In another embodiment, as shown in FIG. 11, the first rear dummy GOA unit 310 may also be arranged adjacent to the second front dummy GOA unit 220. In this embodiment, the driving mode of the scanning lines of the display area 11 is that the scanning line voltage driving signals are input from the upper edge and the middle of the display area 11 and scan line by line toward the middle and lower edges of the display area 11, respectively.

In one of the embodiments, the adjacent ends of the cascaded GOA units 100 are provided with one front dummy GOA units 200.

Figure 12:
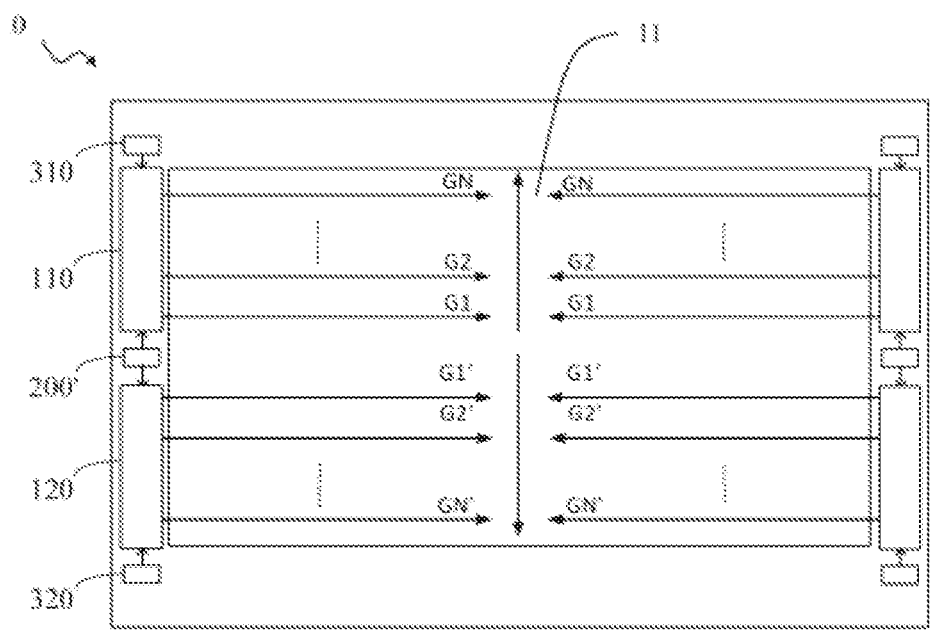
FIG. 12 is a schematic structural diagram of a display panel according to another embodiment.

Specifically, as shown in FIG. 12, using the arrangement of two of the cascaded GOA units 100 on each side of the display panel 10 as an example, for convenience of description, two of the cascaded GOA units 100 on one side of the display area 11 are named as a first cascaded GOA unit 110 and a second cascaded GOA unit 120, respectively. The upper end of the first cascaded GOA unit 110 (that is, the upper edge of the display area) is provided with a first rear dummy GOA unit 310. The lower end of the second cascaded GOA unit 120 (that is, the lower edge of the display area) is provided with a second rear dummy GOA unit 320. The adjacent end of the first cascaded GOA unit 110 and the second cascaded GOA unit 120 (that is, the middle of the display area) is provided with a common front dummy GOA unit 200'. Specifically, the common front dummy GOA unit 200' is coupled to the first cascaded GOA unit 110 and the second cascaded GOA unit 120, respectively. After the common front dummy GOA unit 200' receives the scan start signal STV, the first cascaded GOA unit 110 outputs the scanning line driving signals line by line in the direction of G1 to GN. The second cascaded GOA unit 120 outputs scanning line driving signals line by line in the direction of G1' to GN'. That is to say, the driving mode of the scanning lines is that the scanning line voltage driving signals are input from the middle of the display area 11 and scan line by line toward the upper and lower edges of the display area 11, respectively. Since the driving mode of the cascaded GOA units, the front dummy GOA unit and the rear dummy GOA unit on both sides of the display area 11 are identical, duplicate discussion will be omitted herein.

In this embodiment, the common front dummy GOA unit 200' is shared with the second cascaded GOA unit through the first cascaded GOA unit 110, on one hand, the driving space (that is, GOA space) for driving scanning lines in the display area in the display panel 10 is saved. Thereby, the first cascaded GOA unit 110 and the second cascaded GOA unit 120 are made to be more convenient to connect to the scanning lines in the display area 11. On the other hand, the distance from the source driving (not shown) for driving the data lines in the display area in the display panel 10 to the GOA is saved, and thereby making the space from the wire of Chip On Film (COF) of source to the GOA larger, facilitating wiring.

In one of the embodiments, the adjacent ends of each of the cascaded GOA units 100 are provided with only one rear dummy GOA unit 300.

Figure 13:
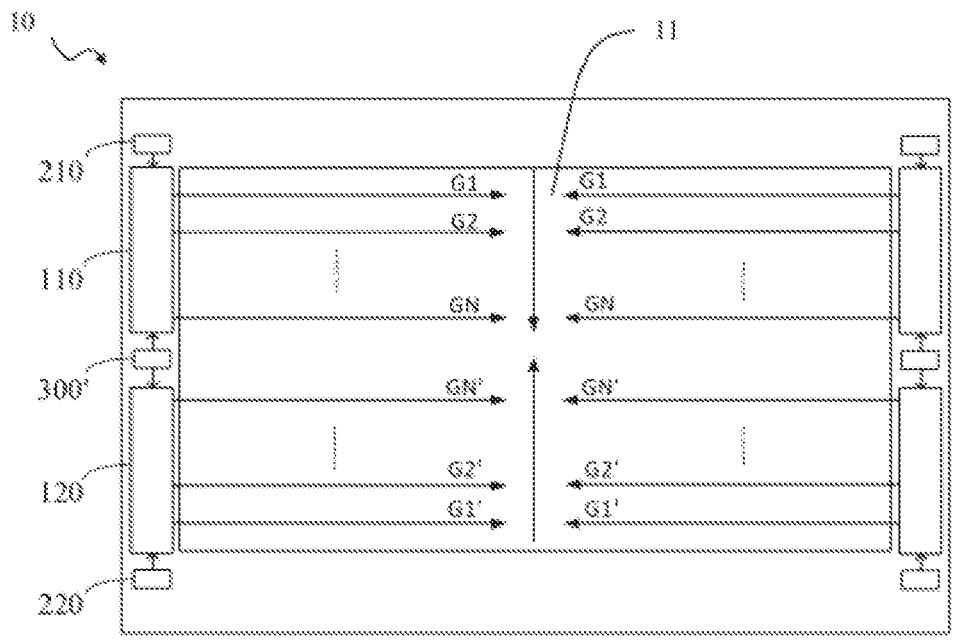
FIG. 13 is a schematic structural diagram of a display panel according to another embodiment.

Specifically, as shown in FIG. 13, using the arrangement of two of the cascaded GOA units 100 on each side of the display panel 10 as an example, for convenience of description, two of the cascaded GOA units 100 on one side of the display area 11 are named as a first cascaded GOA unit 110 and a second cascaded GOA unit 120, respectively. The upper end of the first cascaded GOA unit 110 (that is, the upper edge of the display area) is provided with a first front dummy GOA unit 210. The lower end of the second cascaded GOA unit 120 (that is, the lower edge of the display area) is provided with a second front dummy GOA unit 220. The adjacent end of the first cascaded GOA unit 110 and the second cascaded GOA unit 120 (that is, the middle of the display area) is provided with a common rear dummy GOA unit 300'. Specifically, the common rear dummy GOA unit 300' is coupled to the first cascaded GOA unit 110 and the second cascaded GOA unit 120, respectively. After the first front dummy GOA unit 210 receives the scan start signal STV, the first cascaded GOA unit 110 outputs the scanning line driving signals line by line in the direction of G1 to GN. After the second front dummy GOA unit 220 receives the scan start signal STV, the second cascaded GOA unit 120 outputs the scanning line driving signals line by line in the direction of G1' to GN'. That is to say, the driving mode of the scanning lines is that the scanning line voltage driving signals are input from the upper and lower edges of the display area 11 and scan line by line toward the middle of the display area 11, respectively. Since the driving mode of the cascaded GOA units, the front dummy GOA unit and the rear dummy GOA unit on both sides of the display area 11 are identical, duplicate discussion will be omitted herein.

It can be understood that the common rear dummy GOA unit 300' is adapted to provide reset signals to the first cascaded GOA unit 110 and the second cascaded GOA unit 120, respectively.

In this embodiment, the common rear dummy GOA unit 300' is shared by the second cascaded GOA unit 120 and the first cascaded GOA unit 110. On one hand, the driving space (that is, GOA space) for driving the scanning lines in the display area in the display panel 10 is saved, thereby making the first cascaded GOA unit 110 and the second cascaded GOA unit 120 more convenient to connect to the scanning lines in the display area 11. On the other hand, the distance from the source driving (not shown) for driving the data lines in the display area in the display panel 10 to the GOA is saved, and thereby making the space from the wire of Chip On Film (COF) of source to the GOA larger, facilitating wiring.

Figure 14:
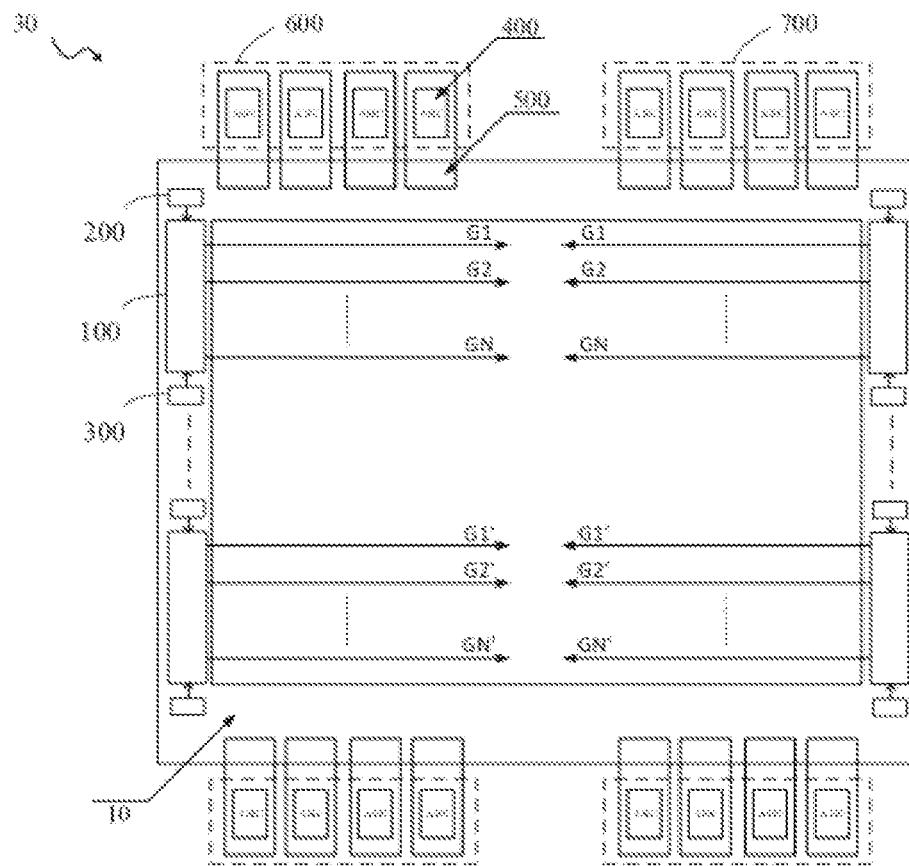
FIG. 14 is a schematic structural diagram of a display device according to an embodiment.

FIG. 14 is a schematic structural diagram of a display device 40 of an embodiment, including the display panel 10 described above and a source driving unit 400. The source driving units 400 are connected to one or both sides of the display panel 10 adjacent to the cascaded GOA units 100.

Specifically, the source driving units 400 are connected to two opposite sides of the display panel 10 through a COF 500. The source driving units 400 on each side are divided into two groups, a first group of source driving 600 and a second group of source driving 700, respectively. The first group of source driving 600 and the second group of source driving 700 have the same number of source driving units 400, and the specific number is determined according to the resolution of the display panel 10 and is not specifically defined herein.

In this embodiment, for a high-resolution display panel, such as an 8K4K display panel, when the size of the display panel is reduced (for example, less than 32 inches), the COF 500 connecting the source driving units 400 cannot be placed on a single side of the display panel, so the source driving units 400 need to be arranged on both sides separately. By using the arrangement of the cascaded GOA units 100 and the common front dummy GOA unit 200' or the common rear dummy GOA unit 300' on the other two sides of the display panel 10, GOA space is saved and the manufacturing of a small-size (less than 32 inches) and high-resolution (8K4K) display panel is realized.

Figure 15:
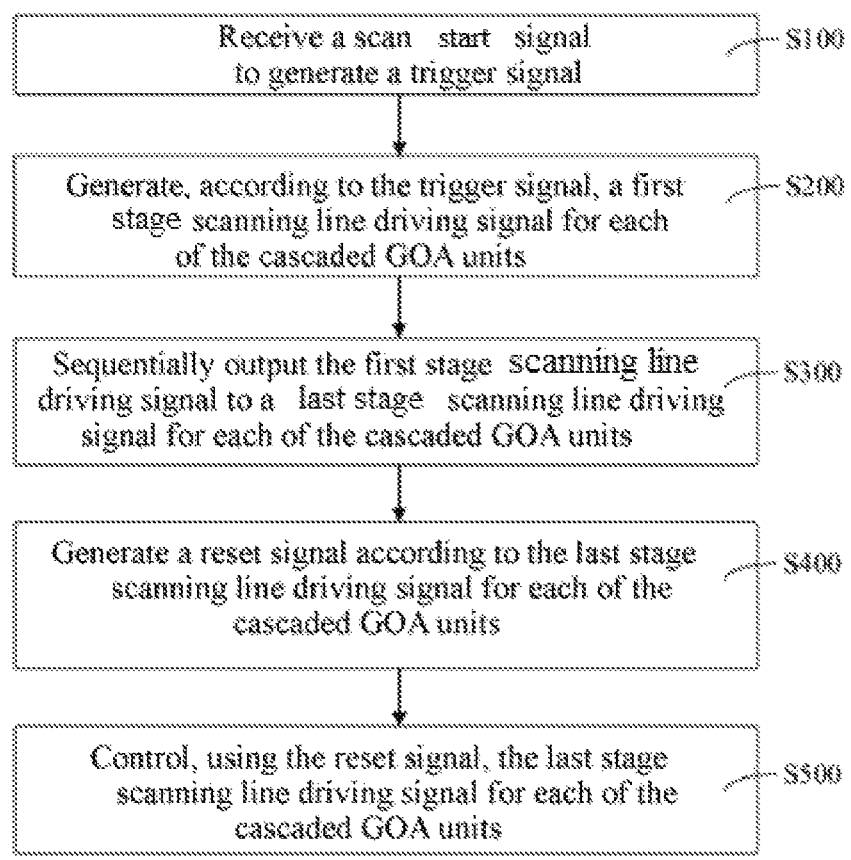
FIG. 15 is a flowchart of a driving method for a display panel according to an embodiment.

FIG. 15 is a flowchart of a driving method for a display panel according to an embodiment, which is applicable to the display panel 10 and the display device 40 described above. The cascaded GOA units 100 sequentially include GOA unit 410 of the first stage to GOA unit 410 of the last stage, each of which is coupled to one of the scanning lines 101. The implementation steps of the driving method specifically include:

Step S100: receiving a scan start signal to generate a trigger signal;

Step S200: generating, according to the trigger signal, a first stage scanning line driving signal for each of the cascaded GOA units 100;

step S300: sequentially outputting the first stage scanning line driving signal to a last stage scanning line driving signal for each of the cascaded GOA units 100;

step S400: generating a reset signal according to the last stage scanning line driving signal for each of the cascaded GOA units 100; and step S500: controlling, using the reset signal, the last stage scanning line driving signal for each of the cascaded GOA units 100.

Specifically, the first stage of GOA units 410 is connected to the front dummy GOA unit 200, and the GOA unit of the last stages 410 is connected to the rear dummy GOA unit 300. The front dummy GOA unit 200 receives a scan start signal to generate a trigger signal. The rear dummy GOA unit 300 generates a reset signal according to the last stage scanning line driving signal for each of the cascaded GOA units 100.

In this embodiment, the GOA unit 410 of the first stage of the cascaded GOA units 100 is connected to one front dummy GOA unit 200. The GOA unit 410 of the last stage of the cascaded GOA units 100 is connected to one rear dummy GOA unit 300. The front dummy GOA unit 200 is configured to receive a scan start signal to generate a trigger signal and input the trigger signal to the first stage of GOA units 410. The first stage of GOA units 410 generates the first stage scanning line driving signal according to the trigger signal. Each of the cascaded GOA units 100 sequentially outputs the first stage scanning line driving signal to a last stage scanning line driving signal according to the cascaded relationship. The rear dummy GOA unit 300 is configured to receive the last stage scanning line driving signal output by the GOA unit of the last stage 410 and generate a reset signal to be input to the GOA unit of the last stage 410.

It will be understood that in each of the cascaded GOA units 100, the output signal (scanning line driving signal) of the GOA unit of the previous stage 410 is the input signal for the GOA unit 410 of the next stage, in addition to the first and GOA unit of the last stage 410. The output signal (scanning line driving signal) of the GOA unit of a next stage 410 is the reset signal for the GOA unit of the previous stage 410. An initial signal STV is provided by the system as an input signal (scan start signal) to the front dummy GOA unit 200. The reset signal is provided by the rear dummy GOA unit 300 as the reset signal for the GOA unit 410 of the last stage, thereby sequentially outputting the first stage scanning line driving signal to a last stage scanning line driving signal and scanning each gate line by line.

The display panel 10 described above is provided with a plurality of the cascaded GOA units 100, and each of the cascaded GOA units 100 is coupled to a plurality of the scanning lines 101. The scanning line driving signals of the corresponding cascaded GOA units 100 are controlled by using the front dummy GOA unit 200 and the rear dummy GOA unit 300, thereby realizing the output of the scanning line driving signals for each of the scanning lines 101 on the display panel 10. Since the display panel 10 is provided with a plurality of the cascaded GOA units 100, the number of the scanning lines 101 coupled to each of the cascaded GOA units 100 is thus reduced, and thereby the input time of scanning line driving signal for each of the scanning lines 101 is increased and the charging efficiency of the display panel 10 is improved.

Finally, it should be noted that the relational terms herein such as first and second are used only to differentiate an entity or operation from another entity or operation, and do not require or imply any actual relationship or sequence between these entities or operations. Moreover, the terms "include", "comprise", and any variants thereof are intended to cover a non-exclusive inclusion. Therefore, in the context of a process, method, object, or device that includes a series of elements, the process, method, object, or device not only includes such elements, but also includes other elements not specified expressly, or may include inherent elements of the process, method, object, or device. Without further limitation, the element defined by a phrase "include one . . . " does not exclude other same elements in the process, method, article or device which include the element.

It should be noted that the embodiments in this specification are all described in a progressive manner. Description of each of the embodiments focuses on differences from other embodiments, and reference may be made to each other for the same or similar parts among respective embodiments.

The above description of the disclosed embodiments enables a person skilled in the art to implement or use this application. Various modifications to these embodiments are obvious to a person skilled in the art, the general principles defined herein may be implemented in other embodiments without departing from the spirit and scope of this application. Therefore, this application is not limited to these embodiments illustrated herein, but needs to conform to the broadest scope consistent with the principles and novel features disclosed herein.

What is claimed is:

1. A display panel, comprising:
one or more cascaded Gate Driver on Array (GOA) units, the one or more cascaded GOA units being arranged on at least one side of the display panel, and each of the one or more cascaded GOA units being coupled to a plurality of scanning lines and outputting a driving signal for each of the plurality of scanning lines in a preset sequence;
one or more front dummy GOA units, one end of each of the one or more cascaded GOA units being arranged with one of the one or more front dummy GOA units, and the one of the one or more front dummy GOA units being configured to generate a trigger signal and output the trigger signal to the each of the one or more cascaded GOA units on which the one of the one or more front dummy GOA units being arranged; and
one or more rear dummy GOA units, another end of each of the cascaded GOA units being arranged with one of the one or more rear dummy GOA units, and the one of the one or more rear dummy GOA units being configured to generate a reset signal and output the reset signal to the each of the one or more cascaded GOA units on which the one of the one or more rear dummy GOA units being arranged;
wherein each of the one or more cascaded GOA units sequentially comprises a GOA unit of a first stage to a GOA unit of a last stage, and a GOA unit of each of the first stage to the last stage is coupled to one of the plurality of scanning lines;
wherein for each of the one or more cascaded GOA units, an output end of a GOA unit of a previous stage of the first stage to the last stage is connected to an input end of a GOA unit of a next stage of the first stage to the last stage, a reset end of the GOA unit of the previous stage is connected to an output end of the GOA unit of the next stage, an input end of the GOA unit of the first stage is configured to receive a trigger signal generated by one of the one or more front dummy GOA units which is arranged on the each of the one or more cascaded GOA units, and a reset end of the GOA unit of the last stage is configured to receive a reset signal generated by one of the one or more rear dummy GOA unit which is arranged on the each of the one or more cascaded GOA units.

2. The display panel according to claim 1, wherein the one or more cascaded GOA units are arranged on opposite sides of the display panel, and at least two of the one or more cascaded GOA units are arranged on each of the opposite sides.

3. The display panel according to claim 2, wherein adjacent ends of the one or more cascaded GOA units are each provided with one of the one or more rear dummy GOA units.

4. The display panel according to claim 2, wherein adjacent ends of the one or more cascaded GOA units are provided with one of the one or more front dummy GOA units.

5. The display panel according to claim 2, wherein one of adjacent ends of the one or more cascaded GOA units is provided with one of the one or more front dummy GOA units, and another of the adjacent ends is provided with one of the one or more rear dummy GOA units.

6. The display panel according to claim 2, wherein adjacent ends of the one or more cascaded GOA units share a same one of the one or more front dummy GOA units.

7. The display panel according to claim 2, wherein adjacent ends of the one or more cascaded GOA units share a same one of the one or more rear dummy GOA units.

8. The display panel according to claim 1, wherein the preset sequence comprises outputting a driving signal for the scanning lines line by line.

9. The display panel according to claim 1, wherein the preset sequence comprises outputting a driving signal for the scanning lines every two lines.

10. The display panel according to claim 1, wherein for each of the one or more cascaded GOA units, a first clock signal end of a GOA unit of each of the first stage to the last stage is electrically connected to a first clock signal input line, a second clock signal end of a GOA unit of each of the first stage to the last stage is electrically connected to a second clock signal input line, and a supply voltage signal input end of a GOA unit of each of the first stage to the last stage is electrically connected to a supply voltage signal input line.

11. The display panel according to claim 10, wherein for each of the one or more cascaded GOA units, a first clock signal end of one of the one or more front dummy GOA units which is arranged on the each of the one or more cascaded GOA units is electrically connected to the first clock signal input line, a second clock signal end of the one of the one or more front dummy GOA units which is arranged on the each of the one or more cascaded GOA units is electrically connected to the second clock signal input line, a supply voltage signal input end of the one of the one or more front dummy GOA units which is arranged on the each of the one or more cascaded GOA units is electrically connected to a supply voltage signal input line, an input end of the one of the one or more front dummy GOA units which is arranged on the each of the one or more cascaded GOA units is configured to receive a start signal, an output end of the one of the one or more front dummy GOA units which is arranged on the each of the one or more cascaded GOA units is connected to an input end of the GOA unit of the first stage, and a reset end of the one of the one or more front dummy GOA unit which is arranged on the each of the one or more cascaded GOA units is connected to an output end of the GOA unit of the first stage.

12. The display panel according to claim 10, wherein for each of the one or more cascaded GOA units, a first clock signal end of one of the one or more rear dummy GOA units which is arranged on the each of the one or more cascaded GOA units is electrically connected to the first clock signal input line, a second clock signal end of the one of the one or more rear dummy GOA units which is arranged on the each of the one or more cascaded GOA units is electrically connected to the second clock signal input line, a supply voltage signal input end of the one of the one or more rear dummy GOA units which is arranged on the each of the one or more cascaded GOA units is electrically connected to a supply voltage signal input line, an input end of the one of the one or more rear dummy GOA units which is arranged on the each of the one or more cascaded GOA units is connected to an output end of the GOA unit of the last stage, an output end of the one of the one or more rear dummy GOA units which is arranged on the each of the one or more cascaded GOA units is connected to a reset end of the GOA unit of the last stage, and a reset end of the one of the one or more rear dummy GOA units which is arranged on the each of the one or more cascaded GOA units is electrically connected to a system reset circuit.

13. The display panel according to claim 12, wherein for the each of the one or more cascaded GOA units, the system reset circuit comprises:
a first transistor, a gate of the first transistor being electrically connected to the second clock signal input line; and
a second transistor, a drain of the second transistor being electrically connected to a source of the first transistor and the reset end of the one of the one or more rear dummy GOA units which is arranged on the each of the one or more cascaded GOA units, a source of the second transistor being electrically connected to the supply voltage signal input line, and a gate of the second transistor being electrically connected to the input end of the one of the one or more rear dummy GOA units which is arranged on the each of the one or more cascaded GOA units.

14. A display panel, comprising:
one or more cascaded Gate Driver on Array (GOA) units, the one or more cascaded GOA units being arranged on two opposite sides of the display panel, at least two of the one or more cascaded GOA units being arranged on each of the two opposite sides, and each of the one or more cascaded GOA units being coupled to a plurality of scanning lines and outputting a driving signal for each of the scanning lines line by line;
one or more front dummy GOA units, on one end of each of the one or more cascaded GOA units being arranged with one of the one or more front dummy GOA units, and the one of the one or more front dummy GOA units being configured to generate a trigger signal and output the trigger signal to the each of the one or more cascaded GOA units on which the one of the one or more front dummy GOA units being arranged; and
one or more rear dummy GOA units, another end of each of the cascaded GOA units being arranged with one of the one or more rear dummy GOA units, and the one of the one or more rear dummy GOA units being configured to generate a reset signal and output the reset signal to the each of the one or more corresponding cascaded GOA units on which the one of the one or more rear dummy GOA units being arranged;
wherein, a source driving unit is connected to the display panel through a chip on film (COF);

wherein each of the one or more cascaded GOA units sequentially comprises a GOA unit of a first stage to a GOA unit of a last stage, and a GOA unit of each of the first stage to the last stage is coupled to one of the plurality of scanning lines;

wherein for each of the one or more cascaded GOA units, an output end of a GOA unit of a previous stage of the first stage to the last stage is connected to an input end of a GOA unit of a next stage of the first stage to the last stage, a reset end of the GOA unit of the previous stage is connected to an output end of the GOA unit of the next stage, an input end of the GOA unit of the first stage is configured to receive a trigger signal generated by one of the one or more front dummy GOA units which is arranged on the each of the one or more cascaded GOA units, and a reset end of the GOA unit of the last stage is configured to receive a reset signal generated by one of the one or more rear dummy GOA unit which is arranged on the each of the one or more cascaded GOA units.

15. The display panel according to claim 14, wherein adjacent ends of the one or more cascaded GOA units are each provided with one of the one or more front dummy GOA units or one of the one or more rear dummy GOA units.

16. The display panel according to claim 14, wherein adjacent ends of the one or more cascaded GOA units share a same one of the one or more front dummy GOA units or share a same one of the one or more rear dummy GOA units.

17. A driving method for a display panel, the display panel comprising: one or more cascaded Gate Driver on Array (GOA) units, the one or more cascaded GOA units being arranged on at least one side of the display panel, and each of the one or more cascaded GOA units being coupled to a plurality of scanning lines and outputting a driving signal for each of the plurality of scanning lines in a preset sequence;

one or more front dummy GOA units, one end of each of the one or more cascaded GOA units being arranged with one of the one or more front dummy GOA units, and the one of the one or more front dummy GOA units being configured to generate a trigger signal and output the trigger signal to the each of the one or more cascaded GOA units on which the one of the one or more front dummy GOA units being arranged; and one or more rear dummy GOA units, another end of each of the cascaded GOA units being arranged with one of the one or more rear dummy GOA units, and the one of the one or more rear dummy GOA units being configured to generate a reset signal and output the reset signal to the each of the one or more cascaded GOA units on which the one of the one or more rear dummy GOA units being arranged, each of the one or more cascaded GOA units sequentially comprising a GOA unit of a first stage to a GOA unit of a last stage, and a GOA unit of each of the first stage to the last stage being coupled to one of the plurality of scanning lines; for each of the one or more cascaded GOA units, an output end of a GOA unit of a previous stage of the first stage to the last stage being connected to an input end of a GOA unit of a next stage of the first stage to the last stage, a reset end of the GOA unit of the previous stage being connected to an output end of the GOA unit of the next stage, an input end of the GOA unit of the first stage being configured to receive a trigger signal generated by one of the one or more front dummy GOA units which is arranged on the each of the one or more cascaded GOA units, and a reset end of the GOA unit of the last stage being configured to receive a reset signal generated by one of the one or more rear dummy GOA unit which is arranged on the each of the one or more cascaded GOA units; and the method comprising:
receiving a scan start signal to generate a trigger signal;
generating, according to the trigger signal, a first stage scanning line driving signal for each of the one or more cascaded GOA units;
sequentially outputting the first stage scanning line driving signal to a last stage scanning line driving signal for each of the one or more cascaded GOA units;
generating a reset signal according to the last stage scanning line driving signal for each of the one or more cascaded GOA units; and
controlling, using the reset signal, the last stage scanning line driving signal for each of the one or more cascaded GOA units.

18. The driving method according to claim 17, wherein for each of the one or more cascaded GOA units, the GOA unit of the first stage is connected to one of the one or more front dummy GOA units which is arranged on the each of the one or more cascaded GOA units, and the GOA unit of the last stage is connected to one of the one or more rear dummy GOA units which is arranged on the each of the one or more cascaded GOA units; the one of the one or more front dummy GOA units which is arranged on the each of the one or more cascaded GOA units receives the scan start signal to generate the trigger signal; and the one of the one or more rear dummy GOA units generates the reset signal according to the last stage scanning line driving signal for the each of the cascaded GOA units.

* * * * *